United States Patent
Schuehrer et al.

(10) Patent No.: US 7,820,536 B2
(45) Date of Patent: Oct. 26, 2010

(54) METHOD FOR REMOVING A PASSIVATION LAYER PRIOR TO DEPOSITING A BARRIER LAYER IN A COPPER METALLIZATION LAYER

(75) Inventors: Holger Schuehrer, Dresden (DE); Tobias Letz, Dresden (DE); Frank Koschinsky, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 518 days.

(21) Appl. No.: 11/468,834

(22) Filed: Aug. 31, 2006

(65) Prior Publication Data
US 2007/0123034 A1    May 31, 2007

(30) Foreign Application Priority Data
Nov. 30, 2005    (DE) .................. 10 2005 057 061

(51) Int. Cl.
*H01L 21/20* (2006.01)
(52) U.S. Cl. ............... 438/584; 438/629; 257/E21.579; 257/E21.585
(58) Field of Classification Search ......... 438/584–629, 438/634, 687; 257/E21.579, E21.585
See application file for complete search history.

(56) References Cited

U.S. PATENT DOCUMENTS

| 5,736,002 | A | 4/1998 | Allen et al. ............... 156/628.1 |
| 5,824,599 | A * | 10/1998 | Schacham-Diamand et al. ..................... 438/678 |
| 6,706,629 | B1 * | 3/2004 | Lin et al. ..................... 438/687 |
| 6,812,133 | B2 * | 11/2004 | Takeuchi ..................... 438/623 |
| 6,838,370 | B1 | 1/2005 | Niuya et al. ................. 438/623 |
| 6,951,809 | B2 * | 10/2005 | Tarumi et al. ................ 438/627 |
| 2003/0008509 | A1 | 1/2003 | Kofuji et al. ................. 438/692 |
| 2003/0186544 | A1 | 10/2003 | Matsui et al. ............... 438/687 |
| 2007/0049007 | A1 * | 3/2007 | Yang et al. .................. 438/625 |

FOREIGN PATENT DOCUMENTS
EP    1345270 A2    10/2002
WO    WO 00/02238    1/2000

* cited by examiner

*Primary Examiner*—Khiem D Nguyen
(74) *Attorney, Agent, or Firm*—Williams, Morgan & Amerson

(57) ABSTRACT

By forming a thin passivation layer after the formation of openings connecting to a highly reactive metal region, any queue time effects may be significantly reduced. Prior to the deposition of a barrier/adhesion layer, the passivation layer may be efficiently removed on the basis of a heat treatment so as to initiate material removal by evaporation.

19 Claims, 4 Drawing Sheets

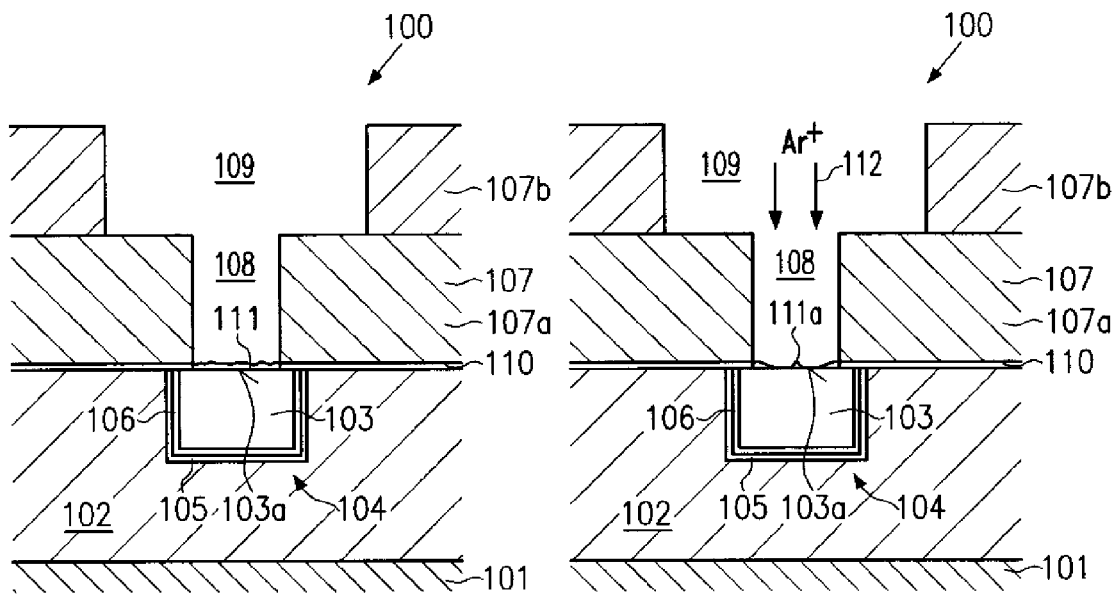
Fig. 1a
(prior art)
Fig. 1b
(prior art)
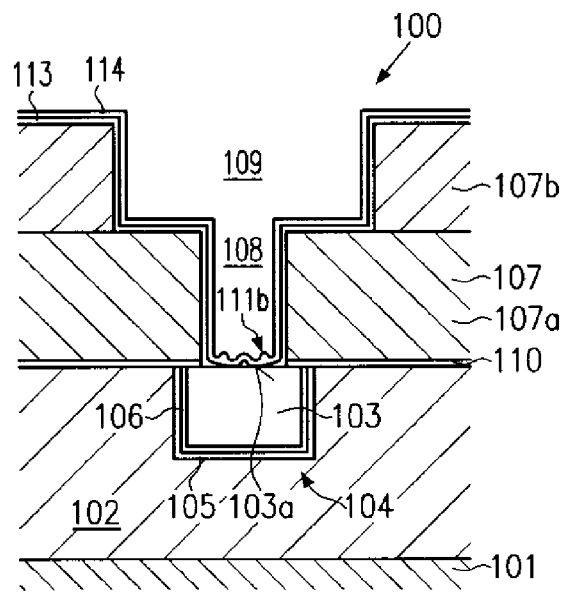
Fig. 1c
(prior art)

METHOD FOR REMOVING A PASSIVATION LAYER PRIOR TO DEPOSITING A BARRIER LAYER IN A COPPER METALLIZATION LAYER

BACKGROUND OF THE INVENTION

1. Field of the Invention

Generally, the present invention relates to the formation of integrated circuits, and, more particularly, to the formation of metallization layers including highly conductive metals, such as copper, embedded into a dielectric material having low permittivity to enhance device performance.

2. Description of the Related Art

In an integrated circuit, a huge number of circuit elements, such as transistors, capacitors, resistors and the like, are formed in or on an appropriate substrate, usually in a substantially planar configuration. Due to the large number of circuit elements and the required complex layout of the integrated circuits, generally, the electrical connection of the individual circuit elements may not be established within the same level on which the circuit elements are manufactured, but requires one or more additional "wiring" layers, also referred to as metallization layers. These metallization layers generally include metal-containing lines providing the inner-level electrical connection and also include a plurality of interlevel connections, also referred to as vias, filled with an appropriate metal and providing the electrical connection between two neighboring stacked metallization layers, wherein the metal-containing lines and vias may also be commonly referred to as interconnect structures.

Due to the continuous shrinkage of the feature sizes of circuit elements in modern integrated circuits, the number of circuit elements for a given chip area, that is the packing density, also increases, thereby requiring an even larger increase in the number of electrical interconnections to provide the desired circuit functionality. Therefore, the number of stacked metallization layers usually increases as the number of circuit elements per chip area becomes larger. The fabrication of a plurality of metallization layers entails extremely challenging issues to be solved, such as mechanical, thermal and electrical reliability of a plurality of stacked metallization layers that may be employed on sophisticated microprocessors. Semiconductor manufacturers are increasingly replacing the well-known metallization metal aluminum by a metal that allows higher current densities and hence allows a reduction in the dimensions of the interconnections and thus the number of stacked metallization layers. For example, copper and alloys thereof are materials used for replacing aluminum due to their superior characteristics in view of higher resistance against electromigration and significantly lower electrical resistivity when compared with aluminum. Despite these advantages, copper also exhibits a number of disadvantages regarding the processing and handling of copper in a semiconductor facility. For instance, copper may not be efficiently applied onto a substrate in larger amounts by well-established deposition methods, such as chemical vapor deposition (CVD), and also may not be effectively patterned by the usually employed anisotropic etch procedures. Consequently, in manufacturing metallization layers including copper, the so-called damascene or inlaid technique (single and dual) is therefore preferably used, wherein a dielectric layer is first applied and then patterned to receive trenches and vias, which are subsequently filled with a copper-based metal. A further major drawback of the use of copper is its propensity to readily diffuse in many dielectric materials such as silicon dioxide, which is a well-established and approved dielectric material in fabricating integrated circuits.

It is therefore necessary to employ a so-called barrier material in combination with a copper-based metallization to substantially avoid diffusion of dielectrics into the copper, thereby negatively modifying its electric characteristics, and also reduce any diffusion of copper into the surrounding dielectric material, as copper may readily migrate to sensitive semiconductor areas, thereby significantly changing the characteristics thereof. The barrier material provided between the copper and the dielectric material should, however, in addition to the required barrier characteristics, exhibit good adhesion to the dielectric material as well as to the copper to impart superior mechanical stability to the interconnect and should also have as low an electrical resistance as possible so as to not unduly compromise the electrical properties of the interconnection.

With the continuous shrinkage of features sizes of the circuit elements, the dimensions of the interconnects are reduced too, thereby also necessitating a reduced layer thickness of the barrier materials in interconnects so as to not unduly consume precious space of the actual metal that exhibits a considerably higher conductivity compared to the barrier material. Hence, complex barrier technologies are required to support further device scaling, wherein the usage of dielectric materials with reduced permittivity may even impart further restrictive constraints to the barrier layer, as will be described with reference to FIGS. 1a-1c for a typical process technique for sophisticated copper-based integrated circuits.

FIG. 1a depicts a schematic cross-sectional view of a semiconductor structure 100 comprising a substrate 101, for example, a semiconductor substrate bearing a plurality of individual circuit elements (not shown), such as transistors, resistors, capacitors and the like. The substrate 101 is representative of any type of appropriate substrate with or without any additional circuit elements and may, in particular, represent sophisticated integrated circuit substrates having included therein circuit elements with critical feature sizes in the deep sub-micron range. A first dielectric layer 102 is formed above the substrate 101 and includes a conductive region 104, for instance an interconnect structure comprised of a metal line 103, such as a copper line, and a first barrier layer 106 comprised of tantalum, and a second barrier layer 105 comprised of tantalum nitride. The dielectric layer 102 and the interconnect feature 104 may represent a first metallization layer. An etch stop layer 110 comprised of, for instance, silicon nitride, nitrogen-enriched silicon carbide and the like is formed above the dielectric layer 102 and partially above the copper line 103. A second dielectric layer 107 comprising at least in its upper portion 107b a dielectric material of low permittivity, as is typically used for obtaining reduced parasitic capacitances between adjacent metal lines, is formed over the etch stop layer 110 and the first dielectric layer 102 and has formed therein a trench 109 in the upper portion 107b and a via 108 in a lower portion 107a connecting to the metal line 103, thereby exposing a contamination layer 111 located on a surface portion 103a of the copper line 103. For example, the lower portion 107a may be comprised of fluorine-doped silicon dioxide deposited from TEOS, which is also referred to as FTEOS and which has a lower permittivity compared to pure TEOS silicon dioxide.

A typical process flow for forming the semiconductor structure 100 as shown in FIG. 1a may include the following steps, wherein, for the sake of simplicity, only the formation of the second metallization layer, i.e., the second dielectric layer 107 and the metal interconnect feature to be formed therein, will be described in detail, as the processes for forming the interconnect feature 104 in the first dielectric layer 102 may substantially involve the same process steps. Thus, after planarizing the dielectric layer 102, including the interconnect feature 104 and forming the etch stop layer 110, thereby passivating the interconnect structure 104, as pure copper forms a highly reactive surface, the dielectric layer 107 is deposited by well-known deposition methods, such as plasma enhanced chemical vapor deposition (PECVD), spin-on techniques and the like, wherein, as previously pointed out, silicon dioxide including fluorine deposited from TEOS by chemical vapor deposition (CVD) is frequently employed. Subsequently, the dielectric layer 107 is patterned by well-known photolithography and anisotropic etch techniques, wherein an intermediate etch stop layer (not shown) may be used in patterning the trench 109. It should further be noted that different approaches may be employed in forming the trench 109 and the via 108, such as a so-called via first/trench last approach or a trench first/via last approach, or, in other approaches, the via 108 may be formed first and filled with metal prior to the formation of the trench 109. In the present example, a so-called dual damascene technique is described in which the trench 109 and the via 108 are simultaneously filled with metal.

Irrespective of the etch scheme used, in the last etch step for forming the via 108, the etch stop layer 110 is opened and the copper surface 103a is exposed to the reactive etch ambient, which may contain fluorine, in particular when the dielectric layer 107 also comprises fluorine. As a consequence, the contamination layer 111 containing a copper/fluorine/oxygen compound may be formed on the surface portion 103a. Since the contamination layer 111 may significantly affect the further processes, such as the formation of a barrier layer and seed layer for the subsequent copper fill process, thereby reducing via reliability and lowering product yield and reliability, the contamination layer 111 is typically removed by a wet chemical etch process on the basis of, for example, diluted fluoric acid (HF) or other appropriate chemicals. It has been found that during this wet chemical process the contamination layer 111 is effectively removed, yet the surface portion 103a is again exposed to a reactive environment, thereby resulting in a re-creation of a contamination layer having a similar negative effect on the further processing as the layer 111. Consequently, during the process of forming a barrier/adhesion layer, a sputter pre-clean process is performed for removing further contaminants from the surface portion 103a.

FIG. 1b schematically shows the semiconductor structure 100 during an initial phase of a sputter process, indicated as 112, wherein argon ions may be directed to the surface portion 103a in an attempt to remove the contamination layer 111 or contaminants 111a that are still left after the wet chemical clean process that may have been performed. Thereafter, the sputter parameters are re-adjusted to deposit a barrier/adhesion layer, for instance on the basis of tantalum and/or tantalum nitride. Owing to the incomplete removal of the contaminants 111a during the initial pre-clean process, irregularities may still be present at the surface portion 103a after the formation of the barrier/adhesion layer, the formation of a seed layer and the deposition of the bulk copper.

FIG. 1c schematically shows the semiconductor structure 100 with a barrier/adhesion layer 113 and a copper seed layer 114 formed on the structure 100 and within the trench 109 and the via 108. At the surface portion 103a, irregularities 111b may be formed, which may lead to reduced via reliability due to, for instance, an increased transition resistivity between the via 108, after being filled with copper, and the metal line 103. The problem of reduced via reliability is even exacerbated for highly scaled devices, since the reduced cross-section of the via 108 may require even more restricted margins with respect to resistivity fluctuations of the vias 108.

In view of the above-identified problems, there is a need for an improved technique for the formation of more reliable metal interconnects, especially of copper interconnects, in highly scaled semiconductor devices.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that may significantly reduce structural irregularities formed within a via that connects to a metal region, such as a copper-containing region. For this purpose, during the formation of metallization layers including vias and trenches, an exposed metal surface, which may be highly reactive when, for example, copper is the dominant part, may be treated to form a passivation layer. The passivation layer may be formed during or after a wet chemical cleaning process for reducing etch-induced contaminants from the exposed metal surface. Due to the provision of the passivation layer, a significant improvement with respect to the further substrate handling may be achieved, thereby substantially avoiding any further chemical reaction of the metal with any contaminants, such as oxygen, fluorine and the like. Thereafter, prior to the formation of a metal or barrier material within the opening, the passivation layer may be removed in a highly efficient manner in a heat treatment, thereby efficiently evaporating substantial portions of the passivation layer. Consequently, a significant yield improvement may be achieved by, for instance, reducing the influence of queue time effects.

According to one illustrative embodiment of the present invention, a method comprises forming an opening in a dielectric layer, wherein the opening connects to a metal region located below the opening. Moreover, the method comprises cleaning a surface portion of the metal region exposed by the opening and forming a passivation layer on the surface portion. Moreover, a heat treatment is performed in a specified low pressure ambient at a specified temperature to substantially remove the passivation layer by evaporation to expose the surface portion. Finally, a barrier/adhesion layer is deposited on the exposed surface portion.

According to another illustrative embodiment of the present invention, a method comprises forming a passivation layer according to a specified process recipe on a first plurality of copper-containing metal regions and exposing each of the first plurality of metal regions comprising the passivation layer to a specified low pressure ambient. The method further comprises treating each of the first metal regions with a different temperature in the specified low pressure ambient to initiate out-gassing of material of the passivation layer. Moreover, a degree of material removal of the passivation layer is determined for each of the first metal regions and a target process temperature is selected on the basis of the previous step of determining the degree of material removal. Finally, a plurality of substrates, each including a second metal region comprising a passivation layer formed according to the specified process recipe during the formation of a metallization layer of the semiconductor device, are processed, wherein the processing of the plurality of substrates comprises the removal of the passivation layer in the specified low pressure ambient on the basis of the selected target process temperature.

According to yet another illustrative embodiment of the present invention, a method comprises forming a via opening in a dielectric layer of a metallization layer of a semiconductor device, wherein the via opening connects to a copper-containing metal region located below the via opening. Moreover, a passivation layer is formed at least on a portion of the metal region exposed by the via opening and the passivation layer is removed by evaporation, followed by the formation of a barrier/adhesion layer in the via opening.

BRIEF DESCRIPTION OF THE DRAWINGS

The invention may be understood by reference to the following description taken in conjunction with the accompanying drawings, in which like reference numerals identify like elements, and in which:

FIGS. 1a-1c schematically show cross-sectional views of a semiconductor device including an interconnect structure formed in a dielectric material, wherein irregularities in the metal may be created by contamination of an exposed surface portion during the formation of a via according to a conventional technique;

Figure 2A:
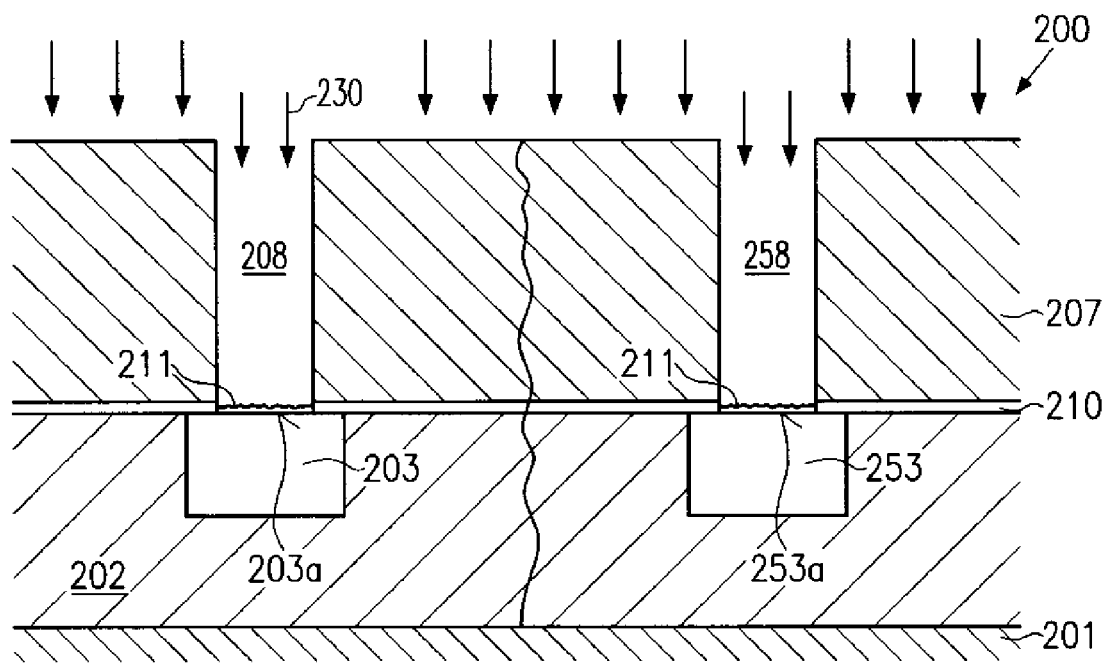
FIG. 2a schematically shows a cross-sectional view of a semiconductor device which may represent a test structure for determining an appropriate process temperature for removing a passivation layer formed on a copper-containing metal region in accordance with illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention contemplates a technique that addresses the problems of surface contamination of exposed metal regions during the formation of vias in a dielectric layer, which may lead to reduced reliability and yield, especially when semiconductor devices are considered that are fabricated on the basis of copper or copper compounds and copper alloys. As previously explained, especially fluorine and oxygen may react with an exposed copper surface, thereby generating a plurality of surface defects, which may lead to significant irregularities during the further processing of the semiconductor devices. Since any etch byproducts created during a preceding etch process for exposing the copper surface may be efficiently removed on the basis of well-established wet chemical cleaning processes, according to the present invention, an efficient passivation layer may be formed during or after the highly efficient wet chemical cleaning processes, thereby efficiently removing or substantially reducing any surface contaminations and also substantially avoiding or reducing the re-formation of contaminations, such as the formation of a copper/fluorine/oxygen layer. Moreover, the substantially passivated surface of the copper-based region may be, prior to the deposition of a barrier/adhesion material, efficiently exposed by a heat treatment to evaporate substantially all of the material of the passivation layer, thereby exposing the surface of the copper-containing metal in a substantially homogenous fashion, resulting in enhanced process uniformity of subsequent deposition processes. Moreover, in some illustrative embodiments, the further deposition of any barrier/adhesion material may be performed substantially without any preceding plasma-based cleaning sequences, thereby reducing the risk of copper contamination of sidewall portions of the corresponding via opening. Consequently, the process uniformity of the subsequent deposition process, as well as the quality of the interface between the via and the copper-based metal region, may be significantly enhanced. As a result, total yield as well as reliability of the interconnect structure may be enhanced.

With reference to FIGS. 2a-3d, further illustrative embodiments of the present invention will now be described in more detail. FIG. 2a schematically shows a cross-sectional view of a semiconductor structure 200 comprising a substrate 201 having formed thereon a plurality of metal regions 203, 253, wherein, for convenience, only two regions are depicted. The substrate 201 may represent any appropriate substrate, such as a silicon substrate, a silicon-on-insulator (SOI) substrate or any other insulating or semiconductive carrier material. The metal regions 203 and 253 may represent any metal that is suitable for forming metallization layers in semiconductor devices and may represent in illustrative embodiments a copper-based region, that is, the regions 203 and 253 may comprise copper, copper compounds, copper alloys and the like. Moreover, the metal regions 203 and 253 may include any barrier/adhesion layers as considered appropriate, although the one or more barrier layers are, however, not shown in FIGS. 2a and 2b for the sake of clarity. In some illustrative embodiments, the semiconductor structure 200 may represent a test structure formed on one or more test substrates and the plurality of metal regions 203 and 253 may be a part of a continuous metal layer. In some embodiments, the metal regions 203 and 253 may be provided on different substrates, when the application of different temperatures within a single substrate may be considered as incompatible with available process tools, as will be described later on. It should be appreciated that the semiconductor structure 200, when acting as a test structure, may be formed in accordance with specific design rules also employed for the formation of actual semiconductor devices of a specified type so that a high degree of authenticity may be achieved when gathering experimental data from the semiconductor structure 200. In other illustrative embodiments, the metal regions 203 and 253 may represent the type of metal used in actual semiconductor devices, wherein the metal regions 203 and 253 may be treated in accordance with a specified process recipe for forming an appropriate passivation layer without providing the additional components of the structure 200 that will be described subsequently.

Consequently, in illustrative embodiments in which the semiconductor structure 200 is to represent a semiconductor structure with high similarity to actual product devices, the metal regions 203 and 253 may be formed in a dielectric layer 202, above which may be located an etch stop layer 210, which may also be partially formed above the metal regions 203 and 253. The etch stop layer 210 may be comprised of any appropriate material, such as silicon nitride, silicon carbide, nitrogen-enriched silicon carbide and the like. A dielectric layer 207, which may include two or more sub-layers, may be formed on the etch stop layer 210, wherein the dielectric layer 207 may be formed so as to exhibit a reduced permittivity in accordance with design rules of actual semiconductor devices. As previously explained with reference to the dielectric layer 107, illustrated in FIGS. 1a-1c, the dielectric layer 207 may also be comprised of any appropriate material, such as silicon dioxide, fluorine-enriched silicon dioxide, a low-k material, possibly in combination with another dielectric material, and the like. In one illustrative embodiment, the dielectric layer 207 may represent a fluorine-doped silicon dioxide layer formed in accordance with deposition recipes as are used in the formation of highly sophisticated semiconductor devices having a copper-based metallization. Moreover, corresponding via openings 208 and 258 may be formed above the metal regions 203 and 253, respectively, wherein the dimensions of the via openings 208 and 258 may be selected in accordance with design rules of a specified semiconductor device of interest. The via openings 208 and 258 in principle connect to the underlying metal regions 203, 253, respectively, wherein, however, on surface portions of the metal regions 203 and 253, a layer 211 may be present, which may include substantially inhomogenously distributed contaminations caused by a reaction with reactive components, such as fluorine, oxygen and the like, which may have been liberated during an etch process for forming the via openings 208 and 258 and/or which may be introduced by the corresponding etch atmosphere.

A typical process for forming the semiconductor structure 200 as shown in FIG. 2a may comprise the following processes. After the formation of the metal regions 203, 253 by, for instance, a damascene technique involving the formation of trenches in the dielectric layer 202 and a subsequent fill of metal into the trenches, or by forming a substantially continuous layer over the substrate 201 by means of a seed layer and a subsequent electrochemical process, the etch stop layer 210 may be formed by well-established techniques, such as plasma enhanced chemical vapor deposition (PECVD). Thereafter, the dielectric layer 207 may be formed by any appropriate deposition technique, selected in accordance with the desired material composition, layer composition and the like. It should be noted that, in view of establishing an appropriate process temperature for removing a passivation layer to be formed after the removal of the contamination layer 211 by a corresponding wet chemical etch process, it may be advantageous to form the semiconductor structure 200 and in particular the layers 210 and 207 in accordance with process strategies of interest so as to gain information on the process of forming the via openings 208 and 258, which may then be directly transferred to a corresponding production process. Hence, the dielectric layer 207 may be comprised, in some embodiments, of a dielectric material on the basis of silicon and oxygen having a moderately low permittivity, such as fluorine-doped silicon dioxide, hydrogenated silicon oxycarbide and the like. However, other materials may be formed on the basis of polymer materials and the like. Respective manufacturing techniques for these materials are well established and will not be described in more detail herein.

Thereafter, photolithography may be employed to form a resist mask (not shown) in conformity with design rules for the via openings 208 and 258. It should be appreciated that, depending on the device dimensions, highly sophisticated lithography techniques may be required. As is well know, advanced semiconductor devices have now reached critical feature sizes of 50 nm and even less at the transistor level, thereby requiring metal lines and vias having dimensions on the order of magnitude of 100 nm and even less, wherein, in particular, the via openings 208, 258 may have an aspect ratio (depth/diameter) of 5 and even higher. For such extremely scaled devices, the contact resistance between the metal regions 203, 253 and the corresponding vias to be formed in the via openings 208, 258 significantly depends on the characteristics of the interface and hence significantly depends on the surface characteristics of a surface portion 203a, 253a, which is exposed during an anisotropic etch process for etching through the dielectric layer 207 and finally through the etch stop layer 210. During the final etch step through the etch stop layer 210, reactive gas components and byproducts, such as fluorine, oxygen and the like, may be present and may react with the exposed surface portions 203a, 253a. Copper is well known to readily react with fluorine and oxygen to form the contamination layers 211, which may exhibit significant structural variations within each layer 211 and across different via openings owing to the highly non-uniform process conditions with respect to the formation of corrosion at the exposed surfaces 203a, 253a. Consequently, after completion of the etch process for opening the etch stop layer 210, a wet chemical process 230 may be performed in order to remove the contamination layers 211. For example, in some illustrative embodiments, the wet chemical process 230 may be performed on the basis of a formulation including an etchant and a surface reactant that may undergo a chemical reaction with the exposed metal surfaces 203a, 253a, thereby forming a substantially continuous passivation layer, as will be described with reference to FIG. 2b. In other embodiments, the surface reactant may represent a so-called corrosion inhibitor, formed, for instance, on the basis of triazole or any compounds thereof, such as benzene triazole (BTA), as are known in the art for preventing or reducing corrosion of copper surfaces and the like. In other embodiments, the etchant for removing the layers 211 may comprise diluted fluoric acid (HF).

Figure 2B:
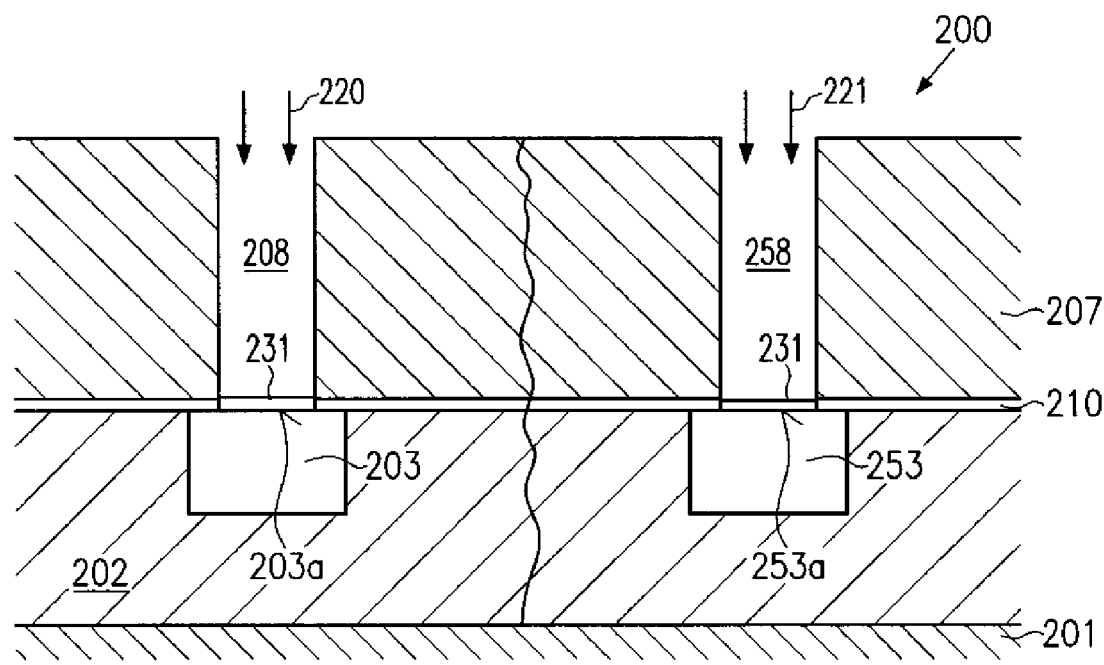
FIG. 2b schematically shows the semiconductor structure 200 after the completion of the wet chemical cleaning process, wherein during or after the process 230 a surface treatment may be performed in order to form a passivation layer 231, at last at the exposed surface portion in accordance with illustrative embodiments of the present invention.

FIG. 2b schematically shows the semiconductor structure 200 after the completion of the wet chemical cleaning process, wherein during or after the process 230 a surface treatment may be performed in order to form a passivation layer 231, at least at the exposed surface portions 203a, 253a. The passivation layer 231, which may comprise a certain amount of carbon when, for instance, formed on the basis of the above-identified materials, may have a thickness of several nanometers or even less and is appropriate for efficiently suppressing, or substantially reducing, any further reaction of the copper-containing material in the regions 203 and 253, thereby relaxing any constraints with respect to substrate handling and transportation prior to subsequent manufacturing processes for filling the via openings 208, 258 with an appropriate material. Furthermore, the semiconductor structure 200 is exposed to a specified low pressure ambient, which may be established such that the ambient may differ in temperature applied to the respective passivation layers 231. For example, the passivation layer 231 in the via opening 208 may be exposed to the specified low pressure conditions with a first temperature indicated as 220, while the corresponding passivation layer 231 in the via opening 258 may be subjected to a different temperature 221 while experiencing substantially the same low pressure conditions. For example, the corresponding temperatures 220 and 221 may be applied in any appropriate process chamber, in which predefined environmental conditions with respect to pressure and temperature may be established, wherein the specified low pressure conditions may be selected such that outgassing of contaminants may be initiated or promoted. For example, a low pressure of ultra-high vacuum conditions up to sub-atmospheric pressure values may be appropriate. In some illustrative embodiments, the respective low pressure conditions are selected on the basis of process requirements of an actual process flow in which, for instance, subsequent to the removal of the passivation layer 231, a barrier material is to be deposited. It should be appreciated that the different temperatures 220, 221 may be applied in such a form that, in one illustrative embodiment, the substrate 201 is heated in a localized fashion, while, in other embodiments, the via openings 208 and 258 may be provided on different substrates having received the same process sequence for forming the passivation layers 231. Consequently, a plurality of via openings may receive substantially the same low pressure conditions including substantially the same heat treatment, while corresponding via openings formed in a different substrate may receive substantially the same low pressure conditions in combination with a different process temperature. In some illustrative embodiments, different recipes for the process 230 for removing contaminants and/or for forming the passivation layers 231 may be used within a single substrate, thereby providing the potential for simultaneously determining the effects of different passivation layers and/or cleaning processes in view of the removal of the respective passivation layers 231.

During the heat treatment based on the different temperatures 220, 221, a material removal may be initiated, wherein a plurality of different temperatures may be used to quantitatively determine the influence of temperature on the removal rate for the material of the passivation layers 231. Consequently, in some embodiments, one or more characteristics of the metal regions 203, 253 and/or of the via openings 208, 258 may be determined in order to estimate the status of the surfaces 203a, 253a having experienced the different treatments on the basis of the different temperatures 220, 221. Based on corresponding measurement results, which may be obtained by electron microscopy, voltage contrast techniques, Auger electron spectroscopy (AES) and the like, an adequate process temperature for a heat treatment for removing the passivation layer 231 may be selected, which may then be used for the processing of one or more other substrates during the formation of a corresponding metallization layer in product substrates. In other embodiments, the effect of the heat treatment on the basis of the temperatures 220, 221 may be assessed during a later manufacturing stage, thereby also including any accumulated effects that may be achieved in combination with subsequent process steps, such as the formation of a barrier/adhesion layer in the via openings 208, 258, followed by a subsequent fill process for providing the copper-based metal. That is, the electrical behavior may be examined and estimated so as to select a suitable process temperature from the plurality of temperatures 220, 221, possibly in combination with appropriate process parameters of the process 230 for cleaning and/or forming the passivation layers 231, for a semiconductor device type of interest. Moreover, the above-specified measurement techniques may also be applied in this advanced manufacturing stage, thereby also providing the potential for quantitatively estimating the entire process sequence so as to select an appropriate process temperature in combination with an appropriate low pressure condition.

Figure 2C:
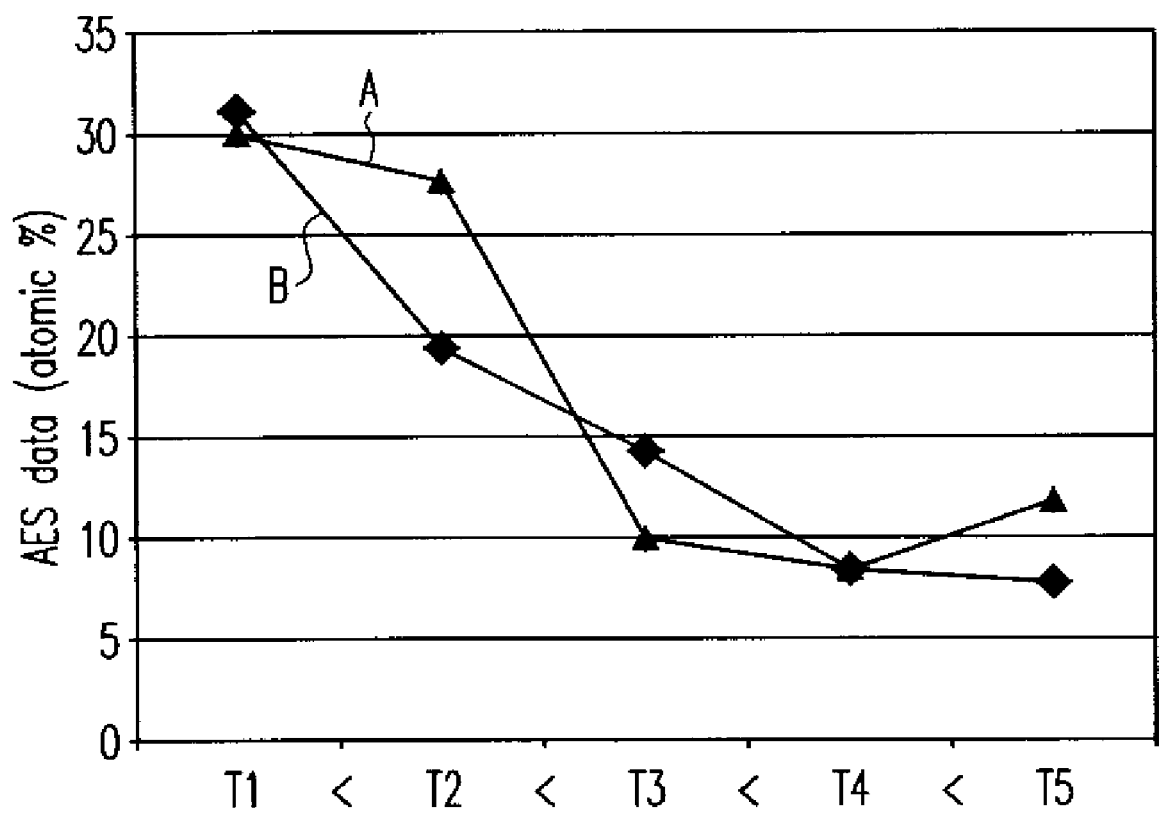
FIG. 2c represents a plot that schematically illustrates exemplary results of determining the degree of material removal at different temperatures for obtaining an appropriate target process temperature for specified low pressure conditions in accordance with illustrative embodiments.

FIG. 2c schematically illustrates exemplary measurement results for the degree of material removal on the basis of a specified low pressure condition for five different process temperatures. In FIG. 2c, the vertical axis represents measurement data obtained from AES (Auger electron spectroscopy), while the horizontal axis represents the temperature for removing respective contamination layers, such as the layers 231, wherein the efficiency of the removal process is estimated on the basis of the carbon residuals detected by the AES procedure. It should be appreciated that, in the present example, five different temperatures have been used, that is, the different temperatures may correspond to the plurality of temperatures 220, 221 for five different temperatures, wherein curve A illustrates the corresponding measurement results for via openings exposed to specified low pressure conditions based on a first parameter setting, while curve B represents the corresponding measurement results for other test samples with the same temperatures but for a different parameter setting for the specified low pressure condition. The corresponding measurement data may have been obtained on the basis of substantially completed vias, i.e., on the basis of vias filled with a barrier/adhesion material and copper. In the illustrated example, the temperature T1, which may for instance correspond to the temperature 220 in FIG. 2b, has been selected to be approximately 150° C. with a 30° interval to the next temperature value. As is evident from FIG. 2c, temperatures corresponding to T3 may be appropriate for removal of the passivation layers 231, since here a reduced carbon content is indicated. Consequently, the temperature T3 may be considered as an "evaporation" temperature, wherein it should be appreciated that this temperature may depend on the specific process flow used and may not reflect the precise point of evaporation of the material of the passivation layer under the given specified low pressure conditions. In view of enhanced process margins, for an actual process, the temperature may be selected somewhat higher than T3, for instance T4, whereas the selection of T5 may lead to a slight increase of carbon contamination resulting from any deleterious processes caused by the moderately high temperature. Moreover, the measurement data seem to indicate that the process conditions described by curve B may be more appropriate, since a higher process stability with respect to temperature variations at least in the range between T4 and T5 may be suggested by the measurement results. It should be appreciated that an appropriate duration of the heat treatment may also be determined on the basis of measurement data as shown in FIG. 2c, wherein different time intervals may be used to identify an appropriate treatment time. For example, for the above-specified chemicals and a thickness of the respective passivation layers, such as the layer 231, of a few nanometers and less, a time period of approximately 20-60 seconds has been appropriate to cover a wide variety of low pressure conditions once an appropriate process temperature is identified. It should be appreciated, however, that any other process parameters with respect to process temperature, specified low pressure condition and treatment time may be readily established by performing corresponding test runs on the basis of the teaching provided in this specification.

Upon identifying an appropriate process recipe, i.e., specifying low pressure conditions that are typically given by the process flow under consideration, a process temperature and a process time, product substrates may be manufactured on the basis of the established process parameters.

With reference to FIGS. 3a-3d, a process for forming a metallization layer including a via will be described in more detail, wherein a wet chemical treatment is used for cleaning and forming a passivation layer followed by removal of the passivation layer on the basis of an appropriate process temperature, which may have been established on the basis of the embodiments previously described with reference to FIGS. 2a-2c.

Figure 3A:
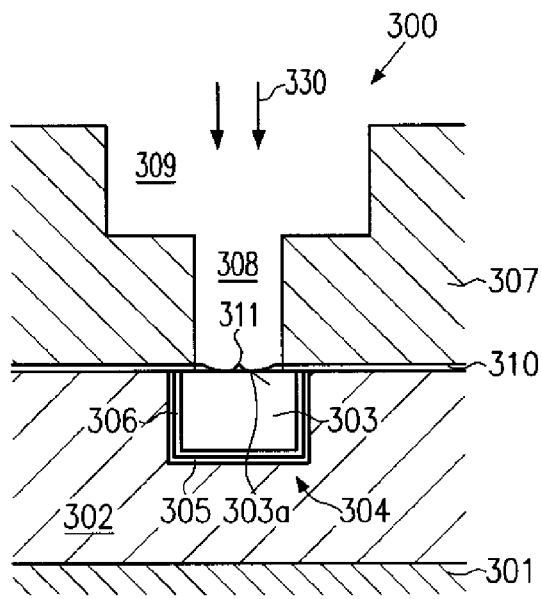
FIGS. 3a-3d schematically show a semiconductor device during various manufacturing stages in forming a copper-based metallization layer according to further illustrative embodiments of the present invention.

In FIG. 3a, a semiconductor device 300 comprises a substrate 301 having formed thereon a first metallization layer comprised of a first dielectric layer 302 including a metal line 304 that contains a metal 303 and a barrier and adhesion layer 305. With respect to the material composition of the various components, the same criteria apply as previously pointed out with respect to FIG. 1a. The same applies for a second dielectric layer 307 formed on an etch stop layer 310, wherein a via opening is formed through the dielectric layers 307 and 310. Furthermore, a trench 309 may be formed in an upper portion of the layer 307. Contaminations 311 may be present on a surface portion 303a, wherein the contaminations 311 may comprise fluorine, oxygen and copper when the metal 303 is a copper-based metal region. Regarding the formation of the semiconductor structure 300 as shown in FIG. 3a, substantially the same processes may be applied as previously described with reference to FIGS. 1a and 2a. That is, the contaminations 311 may have been formed during the anisotropic etch process for forming the via opening 308 through the dielectric layer 307 and the etch stop layer 310. Moreover, the semiconductor device 300 is exposed to a wet chemical treatment 330 for removing the contaminations 311 and, in some illustrative embodiments, for forming a passivation layer, as is previously explained with reference to FIG. 2a. In other illustrative embodiments, the wet chemical treatment 330 may be performed so as to efficiently remove the contaminations 311 and in a subsequent separate process, for instance on the basis of a wet chemical process, a corresponding passivation layer may be formed.

Figure 3B:
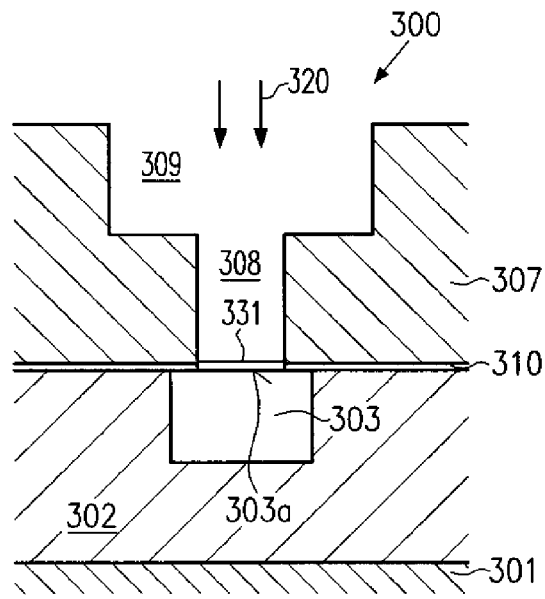

FIG. 3b schematically shows the semiconductor device 300 after the completion of the wet chemical process 330 and after the formation of a passivation layer 331, which is at least formed on the exposed surface portion 303a. It should be appreciated that the semiconductor device 300 as shown in FIG. 3b may exhibit significantly less sensitivity to any substrate handling and manufacturing processes that may have to be performed with the device 300 in a state as shown, since the highly reactive and cleaned surface 303a is efficiently protected by the passivation layer 331. In the manufacturing stage illustrated in FIG. 3b, the semiconductor device 300 is to be prepared for receiving a barrier and adhesion material with the subsequent filling of the via opening 308 and the trench 309 by a highly conductive material, such as copper. For this purpose, the device 300 is exposed to a heat treatment 320, which is defined by specified low pressure conditions and a specified process temperature, wherein the treatment 320 is designed to substantially remove the passivation layer 331 by evaporation. As previously explained, the passivation layer 331 may have a thickness of several nanometers and even less, wherein an appropriate process recipe may have been established on the basis of the measurement results and procedures discussed with reference to FIGS. 2a-2c so as to provide the passivation layer 331 having the required characteristics with respect to passivating the surface 303a and with respect to the removal behavior during the treatment 320. Due to the removal of the passivation layer 331 by the treatment 320 based on evaporation, the contamination of the via opening 308 and the exposed surface 303a may be significantly suppressed compared to other techniques, in which a passivation layer may be removed by a plasma-based process.

Figure 3C:
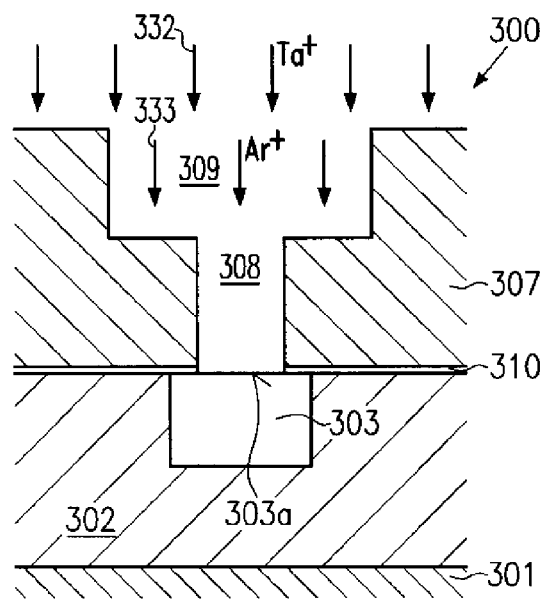

FIG. 3c schematically shows the semiconductor device 300 during the formation of a barrier/adhesion layer by means of a sputter process 332, wherein, in some embodiments, a corresponding sputter-based pre-clean process may be omitted due to the efficient removal of the passivation layer 331 during the preceding treatment 320. In other illustrative embodiments, the treatment 320 and the subsequent deposition process 332 may be performed in situ, that is, the specified low pressure conditions of the treatment 320 may be substantially maintained, i.e., no break of vacuum may be performed during the processes 320 and 331, thereby significantly reducing the risk of contamination of the surface 303a prior to the actual deposition of a barrier material. A corresponding in situ process flow may be advantageous when the deposition process 332 is immediately performed on the surface portion 303a after removal of the passivation layer 331 by means of the treatment 320 without an intermediate plasma-based cleaning process. In a still further illustrative embodiment, the deposition process 332 may include a pre-cleaning process 333 in order to remove any remaining contaminants from the surface portion 303a after removing the passivation layer 331 by the treatment 320. Due to the preceding treatment 320, any residuals on the surface 303a may be removed more efficiently, wherein the pre-cleaning process 333 may be designed such that undue damage to the surface portion 303a, as well as undue copper contamination of the via opening 308, may be significantly reduced, since the pre-cleaning process 333 is confronted with a significantly reduced amount of impurities compared to conventional techniques. In other embodiments, the deposition process 332 may represent a self-limiting deposition technique, known as atomic layer deposition, if very sophisticated barrier/adhesion layers are required, due to extremely scaled semiconductor devices requiring the via opening 308 to have a diameter of 80 nm and even less. It should be appreciated that the substantially uniform defect-free surface 303a offers the potential for further device scaling without jeopardizing the reliability of the metallization of the device 300, since the contact resistance of via opening 308, after being filled with copper, to the underlying metal region 303 may be significantly less compared to conventional techniques, which may produce an increased amount of surface irregularities.

Figure 3D:
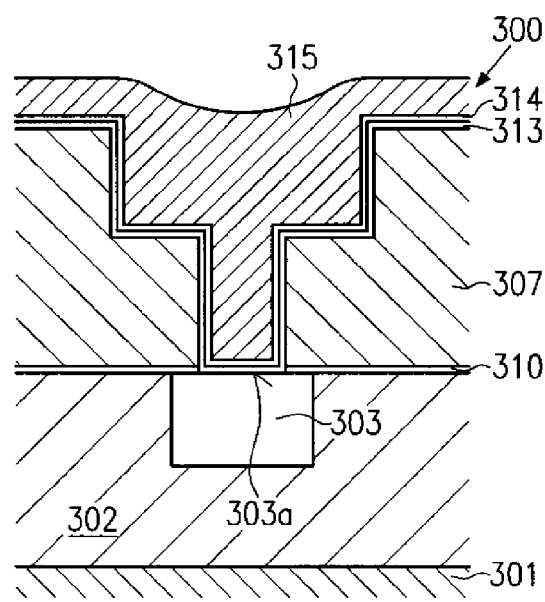

FIG. 3d schematically shows the semiconductor device 300 after the formation of a barrier/adhesion layer 313 by means of the deposition process 332, and with a seed layer 314 and metal bulk layer 315 formed on the barrier/adhesion layer 313. The seed layer 314 as well as the bulk metal layer 315 may, in illustrative embodiments, be formed of copper or copper alloys, while, in other embodiments, other appropriate material compositions may be used for the layers 314 and 315 in accordance with design requirements. Moreover, as previously noted, the barrier/adhesion layer 313 may be comprised of two or more sub-layers, depending on the characteristics of the metal contained in the bulk layer 315. In the embodiments described with reference to FIGS. 3a-3d, the order of forming the trench 309 and the via 308 is not critical. Consequently, the above process regime including the formation of the passivation layer 331 and the removal thereof by means of the temperature-based treatment 320 may be employed with a via first/trench last approach or with a trench first/via last approach. Similarly, the via opening 308 may be formed first, wherein, also in this case, the respective formation of the passivation layer 331 and the removal thereof may be performed as described above, and, after filling the via 308 by any appropriate metal, the trench 309 may be formed. In this process sequence, the trench etch process for forming the trench 309 may be performed on the basis of a corresponding etch stop layer or may be performed without an etch stop layer, depending on device and process requirements, wherein the corresponding etch process may also create respective contaminations when connecting to the underlying via 308, which is already filled by a highly conductive metal, such as copper. Consequently, after the completion of the trench etch process, a corresponding process sequence as previously described, i.e., the formation of a passivation layer and the subsequent removal thereof immediately prior to the deposition of a corresponding barrier layer may also be applied, thereby significantly enhancing production yield as well as interconnect reliability.

As a result, the present invention provides a technique that enables the formation of interconnect structures in which vias and trenches may connect to respective metal regions, such as copper, wherein a significantly reduced amount of irregularities is generated than may be conventionally formed at the interface between two neighboring metal regions, such as a via and an underlying metal region. After the formation of a respective opening connecting to the underlying metal region, a highly efficient wet chemical cleaning process may be performed, in some illustrative embodiments in combination with a subsequent formation of a thin passivation layer, to efficiently remove any etch-induced contaminations. After the contamination removal, a passivation layer may be provided that significantly enhances the further handling of the substrate, since a further reaction of the highly reactive and cleaned copper surface is significantly suppressed, especially for substrates including dielectric materials containing fluorine. After any required substrate handling processes or other intermediate manufacturing processes, the passivation layer may be efficiently removed prior to the formation of a barrier/adhesion layer by a heat treatment that is performed under specified low pressure conditions on the basis of an appropriately selected process temperature for removing the material of the passivation layer on the basis of evaporation. Consequently, the efficiently cleaned copper surface may be reliably exposed without unduly damaging the surface or creating additional copper contamination of sidewall portions of the respective opening. Thereafter, the deposition of the barrier/adhesion material may immediately follow, for instance in an in situ process, or a plasma-based pre-clean process may be performed, wherein, however, less critical process parameters may be used due to the preceding formation of the passivation layer. Consequently, an enhanced process uniformity may be achieved, since queue time effects may be efficiently balanced or may even be completely removed. Thus, production yield and interconnect reliability may be significantly improved.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming an opening in a dielectric layer, the opening connecting to a metal region located below said opening;
    cleaning a surface portion of said metal region exposed by said opening;
    forming a passivation layer on said surface portion;
    performing a heat treatment in a specified low pressure ambient at a specified temperature to substantially remove said passivation layer by evaporation to expose substantially all of said surface portion; and
    depositing a barrier/adhesion layer on said exposed surface portion.

2. The method of claim 1, wherein said passivation layer is formed by a wet chemical process.

3. The method of claim 2, wherein said surface portion is cleaned by a wet chemical process.

4. The method of claim 1, wherein cleaning said surface portion and forming said passivation layer is performed in a common wet chemical process.

5. The method of claim 1, wherein removing said passivation layer and forming said barrier/adhesion layer are performed in an in situ process.

6. The method of claim 5, wherein said barrier/adhesion layer is formed by a sputter process, and wherein said passivation layer is removed by said heat treatment prior to the sputter process in a low pressure ambient established for initiating out-gassing of contaminants.

7. The method of claim 1, further comprising, prior to forming said opening, estimating an evaporation temperature for said specified low pressure ambient on the basis of a test with different temperatures and selecting said specified temperature at or above said estimated evaporation temperature.

8. The method of claim 1, wherein said opening represents a via opening of a copper-based metallization layer and said metal region comprises copper.

9. A method, comprising:
    forming a passivation layer according to a specified process recipe on a first plurality of copper-containing metal regions;

exposing each of said first plurality of copper-containing metal regions comprising said passivation layer to a specified low pressure ambient;

treating each of said first plurality of copper-containing metal regions with a different temperature in said specified low pressure ambient to initiate out-gassing of material of said passivation layer;

determining a degree of material removal of said passivation layer for each of said first plurality of copper-containing metal regions;

selecting a target process temperature on the basis of said determining step; and processing a plurality of substrates, each including a second metal region comprising a passivation layer formed according to said specified process recipe during the formation of a metallization layer of a semiconductor device, said processing comprising the removal of said passivation layer in said specified low pressure ambient on the basis of said selected target process temperature.

10. The method of claim 9, wherein processing said plurality of substrates further comprises forming an opening in a dielectric layer formed above said second metal region prior to forming said passivation layer, said opening connecting to said second metal region.

11. The method of claim 10, wherein processing said plurality of substrates further comprises cleaning a surface portion of said second metal region exposed by said opening and forming said passivation layer on said surface portion.

12. The method of claim 11, wherein processing said plurality of substrates further comprises depositing a barrier/adhesion layer on said exposed surface portion.

13. The method of claim 12, wherein said passivation layer is formed by a wet chemical process.

14. The method of claim 13, wherein said surface portion is cleaned by a wet chemical process.

15. The method of claim 11, wherein cleaning said surface portion and forming said passivation layer is performed in a common wet chemical process.

16. The method of claim 12, wherein removing said passivation layer and forming said barrier/adhesion layer are performed in an in situ process.

17. The method of claim 16, wherein said barrier/adhesion layer is formed by a sputter process, and wherein said passivation layer is removed by a heat treatment prior to the sputter process in said low pressure ambient established for initiating out-gassing of contaminants.

18. A method, comprising:

forming a via opening in a dielectric layer of a metallization layer of a semiconductor device, the via opening connecting to a copper-containing metal region located below said via opening;

forming a passivation layer at least on a portion of said metal region exposed by said via opening;

removing said passivation layer by evaporation;

determining a process temperature for a specified low pressure ambient prior to forming said via opening and using said process temperature for removing said passivation layer in said specified low pressure ambient; and forming a barrier/adhesion layer in said via opening.

19. The method of claim 18, wherein said passivation layer is formed by a wet chemical treatment of said exposed portion.

* * * * *